United States Patent
Homewood et al.

(10) Patent No.: US 8,975,169 B2
(45) Date of Patent: Mar. 10, 2015

(54) METHOD OF MANUFACTURE OF AN OPTOELECTRONIC DEVICE AND AN OPTOELECTRONIC DEVICE MANUFACTURED USING THE METHOD

(75) Inventors: Kevin Peter Homewood, Surrey (GB); Russell Mark Gwilliam, Surrey (GB)

(73) Assignee: The University of Surrey, Surrey (GB)

( * ) Notice: Subject to any disclaimer, the term of this patent is extended or adjusted under 35 U.S.C. 154(b) by 0 days.

(21) Appl. No.: 14/238,558

(22) PCT Filed: Aug. 9, 2012

(86) PCT No.: PCT/EP2012/065559
§ 371 (c)(1),
(2), (4) Date: Feb. 12, 2014

(87) PCT Pub. No.: WO2013/026706
PCT Pub. Date: Feb. 28, 2013

(65) Prior Publication Data
US 2014/0187026 A1 Jul. 3, 2014

(30) Foreign Application Priority Data
Aug. 22, 2011 (GB) .................................. 1114365.8

(51) Int. Cl.
*H01L 21/425* (2006.01)
*H01L 21/265* (2006.01)
*H01L 33/00* (2010.01)
(Continued)

(52) U.S. Cl.
CPC ...... *H01L 21/26513* (2013.01); *H01L 33/0054* (2013.01); *H01L 29/36* (2013.01); *H01L 33/025* (2013.01); *H01S 5/3086* (2013.01); *H01L 33/343* (2013.01)
USPC ............................ 438/529; 257/102; 257/617

(58) Field of Classification Search
USPC .................................. 257/102, 617; 438/529
See application file for complete search history.

(56) References Cited

U.S. PATENT DOCUMENTS

| | | | |
|---|---|---|---|
| 5,077,143 A | 12/1991 | Barraclough et al. | |
| 5,212,101 A | 5/1993 | Canham et al. | |

(Continued)

FOREIGN PATENT DOCUMENTS

| | | |
|---|---|---|
| JP | 01132120 | 5/1989 |
| JP | 09162136 | 6/1997 |
| JP | 2002348198 | 12/2002 |

OTHER PUBLICATIONS

International Search Report for PCT/EP2012/065559 dated Oct. 31, 2012.

(Continued)

*Primary Examiner* — Marvin Payen
(74) *Attorney, Agent, or Firm* — Nicholas B. Trenkle; Stites & Harbison PLLC

(57) ABSTRACT

A method of manufacture of an optoelectronic device includes the steps of: providing or forming a body of crystalline silicon containing substitutional carbon atoms, and irradiating said body of crystalline silicon with protons (H⁺) to create radiative defect centers in a photoactive region of the device, wherein at least some of said defect centers are G-center complexes having the form $C_s$—$Si_I$—$C_s$, where $C_s$ is a substitutional carbon atom and $Si_I$ is an interstitial silicon atom. An optoelectronic device (FIG. 3) manufactured using the method is described.

29 Claims, 6 Drawing Sheets

(51) Int. Cl.
*H01L 29/36* (2006.01)
*H01L 33/02* (2010.01)
*H01S 5/30* (2006.01)
*H01L 33/34* (2010.01)

(56) References Cited

U.S. PATENT DOCUMENTS

| | | | |
|---|---|---|---|
| 7,732,867 | B2 | 6/2010 | Akiyama et al. |
| 2004/0077166 | A1 | 4/2004 | Nagal et al. |
| 2004/0175901 | A1 | 9/2004 | Hadji et al. |
| 2005/0124146 | A1 | 6/2005 | Bedell et al. |

OTHER PUBLICATIONS

Written Opinion of the International Searching Authority for PCT/EP2012/065559 dated Oct. 31, 2012.
GB Search Report for GB1114365.8 dated Dec. 21, 2011.
Hoffmann L et al: "Local vibrational modes of a dicarbon—hydrogen center in crystalline silicon", Physica B. Condensed Matter, Amsterdam, NL, vol. 273-274, (Dec. 15, 1999), pp. 275-278.
Ferenczi et al: "Correlation of the concentration of the carbon-associated radiation damage levels with the total carbon concentration in silicon", J. Appl. Phys., vol. 63, No. 1, (Jan. 1, 1998), pp. 183-189.
Davies G et al: "Letter to the Editor; A metastable precursor to the production of the two-carbon-atom 'G' centre in irradiated crystalline silicon", Semiconductor Science and Technology, IOP Publishing Ltd, GB, vol. 3, No. 6, (Jun. 1, 1988), pp. 608-611.
Serre C et al: "Synthesis of SiC microstructures in Si technology by high dose carbon implantation: etch-stop properties", Journal of the Electrochemical Society, ECS, vol. 144, No. 6, (Jun. 1, 1997), pp. 2211-2215.
J. A. Borders: "Formation of SiC in Silicon by Ion Implantation", Applied Physics Letters, vol. 18, No. 11, (Jan. 1, 1971), p. 509.
M.A. Lourenco et al: "Silicon-based light emitting devices", Science Direct, Elsevier, GB, vol. 78, (2005), pp. 551-556.
LT Canham et al: "1.3-μm light-emitting diode from silicon electron irradiated at its damage threshold", Applied Physics Letters, vol. 51, No. 19, (Nov. 9, 1987), pp. 1509-1511.
Sylvain G. Cloutier et al: Optical gain and stimulated emission in periodic nanopatterned crystalline silicon, Nature Materials, Nature Publishing Group, vol. 3, No. 6, (Nov. 20, 2005), pp. 1-5.
'Annealing kinetics of the di-carbon radiation-damage centre in edge-defined film-fed growth silicon', 20th International Conference on Defects in Semiconductors. ICDS-20, Jul. 26-30, 1999, Berkeley, CA, USA Dec. 1999.Elsevier. ISSN 0921-4526, vol. 273, pp. 283-286. (Park et al) . IET Abstract A/N 6575383.
'Radiation induced defects in 3C—SiC and their annealing behavior', Bulletin of the Electrotechnical Laboratory, 1994, Japan, ISSN 0366-9092, vol. 58, No. 2, pp. 55-62, Japanese (Itoh et al)—English abstract IET A/N 4835718.
'Combined infrared absorption and modeling study of a dicarbon—dihydrogen defect in silicon', Physical Review B (Condensed Matter), Nov. 15, 2000, APS through AIP, USA, ISSN 0163-1829, vol. 62, No. 19, pp. 12859-12867, (Lavrov et al )—IET abstract A/N 6768561.

METHOD OF MANUFACTURE OF AN OPTOELECTRONIC DEVICE AND AN OPTOELECTRONIC DEVICE MANUFACTURED USING THE METHOD

This invention relates to optoelectronic devices and their methods of manufacture. The invention finds particular, thought not exclusive, application in the fabrication of silicon photonic integrated circuits wherein one or more optoelectronic device is produced on a Silicon-On-Insulator (SOI) platform.

There is an increasing need to develop silicon-based optoelectronic devices, particularly optical sources, such as optical emitters and optical amplifiers, with a view to implementing fully integrated silicon photonic platforms. However, silicon is an indirect bandgap semiconductor material in which fast, non-radiative recombination of charge carriers is the dominant process. Radiative recombination of electrons and holes, due to band-to-band transitions, is highly unlikely on account of the large mismatch of momentum between the available electron and hole states, and this has tended to hamper the development of such silicon-based devices.

There is a particular requirement for silicon-based optoelectronic devices that are emissive of radiation in the infrared wavelength range from 1200-1600 nm. Luminescence in this wavelength range is of considerable technological importance to applications involving the development of optical fiber communications systems.

A paper, "Silicon-based light emitting devices", M. A. Lourenco et al, Vacuum 78 (2005), p 551-556 describes a light emitting diode comprising a silicon host doped with ions of the rare earth element erbium (Er). The device is reported as being emissive of radiation in the infra-red, principally at the wavelength 1555 nm. The observed luminescence is attributable to transitions between internal energy states of the rare earth element dopant ions. Such transitions are excited by indirect energy transfer processes due to recombination of charge carriers in the silicon host, and this tends to reduce emission rates to an unacceptable level.

A paper, "1.3 µm light-emitting diode from silicon electron irradiated at its damage threshold", L. T Canham et al, Appl. Phys. Lett. 51 (19), 9 Nov. 1987, p 1509-1511 describes a light emitting diode in which the photoactive region contains radiative defect centres. The defect centres are so-called G-centres, having the form of $C_s$—$Si_I$—$C_s$ complexes, where $C_s$ is a substitutional carbon atom and $Si_I$ is an interstitial silicon atom. These defect centres are reported as being emissive in the wavelength range from 1.2 µm to 1.6 µm, with a zero phonon line at 1.28 µm, referred to as the "G-line". The paper describes a method of manufacture whereby such G-centre complexes are produced by electron bombardment of carbon rich silicon to create the required Si interstitial defects ($Si_I$). However, due to the very light mass of the electron, compared to that of the silicon atom, electron energies in excess of 150 keV are required to effect silicon interstitial formation. This is because Si requires a displacement energy of 12-24 eV and, in fact, a 300 keV electron bombardment energy was used. At these energies, sub-surface scatter presents a significant problem. FIG. 1 of the accompanying drawings shows a simulation of the trajectories of 250 keV electrons in a silicon lattice, modeled using the simulation package CASINO. This simulation demonstrates that the electrons have a lateral spread of hundreds of microns giving rise to electron-induced damage throughout the surrounding material, compromising its electrical properties and rendering the technique difficult to implement in CMOS ULSI technology, for example, employing high integration density. Furthermore, given the range of such energetic electrons in solids, masking of material to achieve selective area bombardment would require a mask thickness of the order of a millimeter which is impractical.

According to a first aspect of the invention there is provided a method of manufacture of an optoelectronic device including the steps of: providing or forming a body of crystalline silicon containing substitutional carbon atoms, and irradiating said body of crystalline silicon with protons ($H^+$) to create radiative defect centres in a photoactive region of the device, wherein at least some of said defect centres are G-centres having the form of $C_s$—$Si_I$—$C_s$ complexes, where $C_s$ is a said substitutional carbon atom and $Si_I$ is an interstitial silicon atom.

The inventors have found that proton irradiation does not give rise to the sub-surface scatter problems associated with electron irradiation described herein. Due to the higher mass of the proton (some $10^4$ times that of the electron) sub-surface scatter is significantly reduced thereby confining any lateral ion damage to a region only a few microns wide, even at MeV proton irradiation energies. The electronic energy deposited within the surface region of the silicon host is sufficient to form point defects (i.e. Si vacancies) needed to create G-centres without producing complex, non-radiative damage cascades.

FIG. 2 of the accompanying drawings shows a simulation of the trajectories of 2 MeV protons (hydrogen ions—$H^+$) in a silicon lattice, modeled using the simulation package TRIM. This simulation illustrates the reduced lateral scattering of protons compared to that of electrons shown in FIG. 1.

In preferred embodiments, optoelectronic devices manufactured in accordance with the invention are generally produced on SOI platforms where the device sits on top of an electrically insulating oxide layer buried in a silicon substrate. By an appropriate choice of proton irradiation energy, end-of-range ion damage, caused by the proton flux, can be confined to the silicon substrate below the oxide-layer, leaving the silicon device free from non-radiative damage but replete with the point defects needed to create the required G-centre complexes.

In the case of devices produced on SOI platforms, the device typically has a sub-micron thickness or a thickness of 3 to 5 µm at most. Referring again to FIG. 2, it can be seen that lateral scattering of protons is negligible within this thickness range (expressed as "target depth") because, in comparison to electrons, only a very small percentage of incident protons are subject to backscattering.

In preferred embodiments, the forming step of the method of the invention includes implanting carbon ions in said body of crystalline silicon to produce a concentration of substitutional carbon atoms in the range from $10^{17}$ $Ccm^{-3}$ to $10^{21}$ $Ccm^{-3}$, and the method may include the step of annealing said body of crystalline silicon, preferably at 1000° C. for up to 1 minute, after implanting said carbon ions and prior to irradiating said body with protons. Preferably, the forming step includes sequentially implanting carbon ions at two or more different carbon implantation energies to control carbon concentration as a function of implantation depth. The implantation energies are preferably 10 keV and 30 keV to produce a substantially constant carbon concentration within an implantation depth of up to 100 nm. Proton irradiation energy is preferably in the range from 1 keV to 10 MeV, and optimum results are obtained using proton irradiation energies in the range from 0.5 MeV to 2 MeV. Below 1 keV, protons have insufficient energy to create the required G-centre complexes, whereas proton implantation energies above 10 MeV generally give rise to divacencies and other, non-radiative damage complexes in preference to the require G-centre complexes.

Proton irradiation doses in the range from $1 \times 10^{11}$ $H^+$ $cm^{-2}$ to $1 \times 10^{16}$ $H^+ cm^{-2}$ are preferred and doses in the range from $1 \times 10^{13}$ $H^+$ $cm^{-2}$ to $5 \times 10^{14}$ $H^+$ $cm^{-2}$ are found to be especially beneficial.

In particularly preferred embodiments, the proton irradiation energy is in the range from 0.5 MeV to 2 MeV and the proton irradiation dose is in the range from $1 \times 10^{13}$ $H^+$ $cm^{-2}$ to $5 \times 10^{14}$ $H^+$ $cm^{-2}$, where higher irradiation energies correspond to lower irradiation doses.

According to another aspect of the invention there is provided an optoelectronic device manufactured using a method according to the first aspect of the invention.

The device may be a light emitting diode, an optical amplifier such as a laser or other form of photoemitter e.g. a Schottky diode.

As already explained, in preferred embodiments, the optoelectronic device is produced on a SOI platform and may form part of a silicon photonic integrated circuit.

According to yet another aspect of the invention there is provided a method for forming G-centres in crystalline silicon, including the steps of: providing or forming a body of crystalline silicon containing substitutional carbon atoms, and irradiating said body of crystalline silicon with protons ($H^+$) to create radiative defect centres, wherein at least some of said defect centres are G-centre complexes having the form $C_s$—$Si_I$—$C_s$, where $C_s$ is a substitutional carbon atom and $Si_I$ is an interstitial silicon atom. In preferred implementations, the method for forming G-centres in crystalline silicon includes using one or more of carbon concentration, implantation energy, proton irradiation dose and proton irradiation energy in the preferred respective ranges described hereinbefore with reference to the first aspect of the invention.

Embodiments of the invention are now described, by way of example only, with reference to the accompanying drawings of which:

Figure 5A:
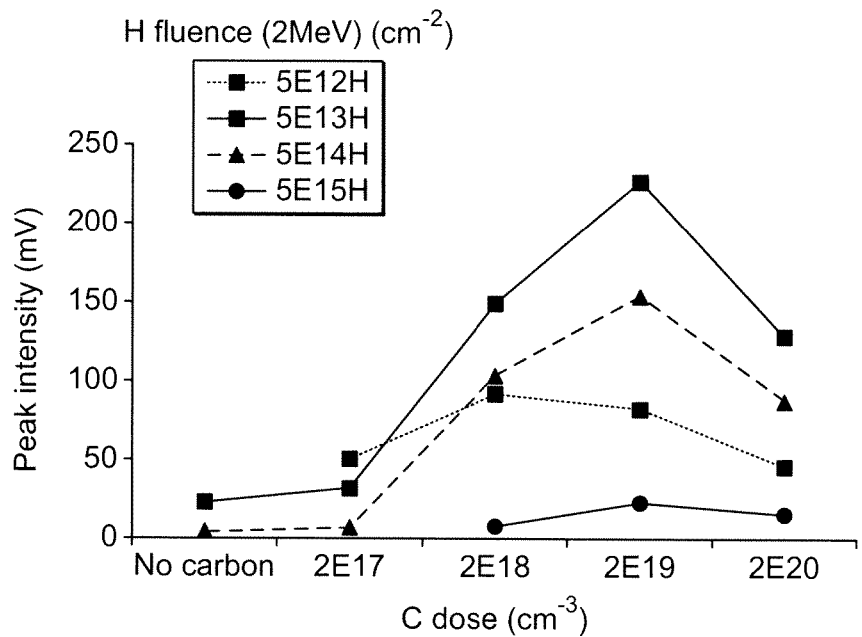
Figure 5B:
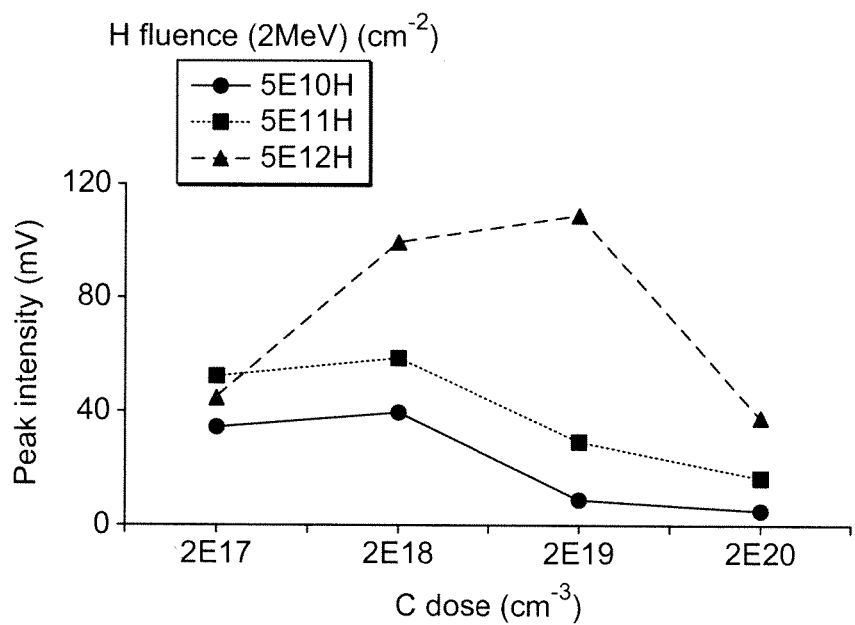
Figure 6:
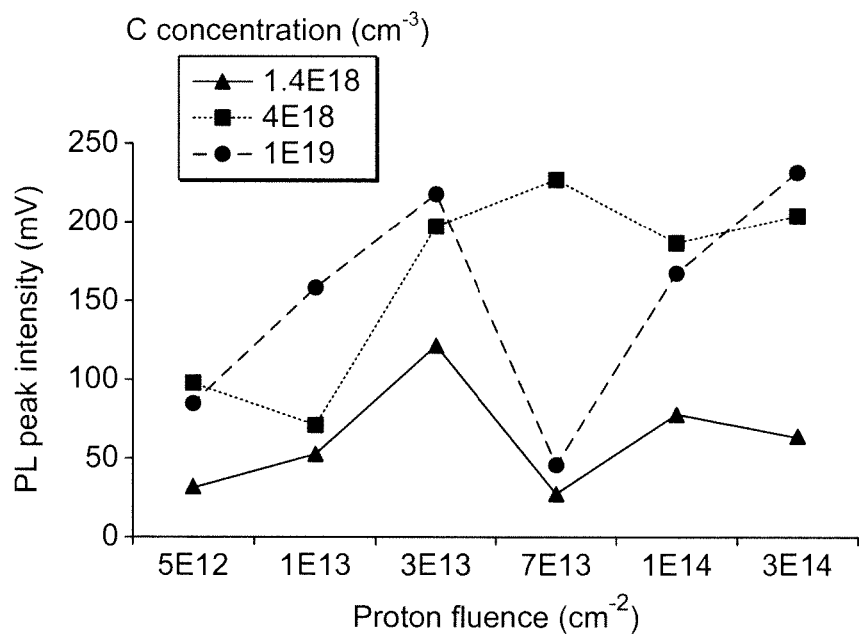
Figure 7:
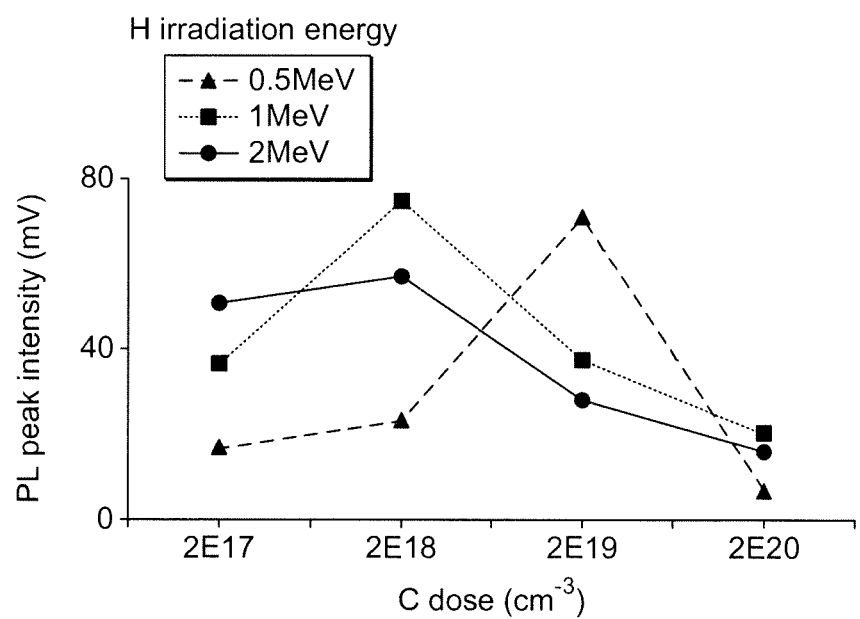

FIGS. 4(a) to 4(d) show photoluminescence (PL) spectra obtained from measurements carried out on a range of crystalline silicon samples containing different implanted carbon concentrations that were irradiated with 2 MeV protons ($H^+$) having proton irradiation doses of $5 \times 10^{12}$ $H^+$ $cm^{-2}$, $5 \times 10^{13}$ $H^+$ $cm^{-2}$, $5 \times 10^{14}$ $H^+$ $cm^{-2}$ and $5 \times 10^{15}$ $H^+$ $cm^{-2}$ respectively;

FIGS. 5(a) and 5(b) show plots of PL peak intensity of crystalline silicon samples (at the G-centre line -1280 nm) as a function of implanted carbon concentration for a range of different proton irradiation doses, at an irradiation energy of 2 MeV;

FIG. 6 shows plots of PL peak intensity of crystalline silicon samples (again at the G-centre line) as a function of proton irradiation dose for a range of different implanted carbon concentrations, at an irradiation energy of 2 MeV; and FIG. 7 shows plots of PL peak intensity of crystalline silicon samples (at the G-centre line) as a function of implanted carbon concentration for a range of different proton irradiation energies, at a fixed proton irradiation dose of $5 \times 10^{11}$ $H^+$ $cm^{-2}$.

Figure 1:
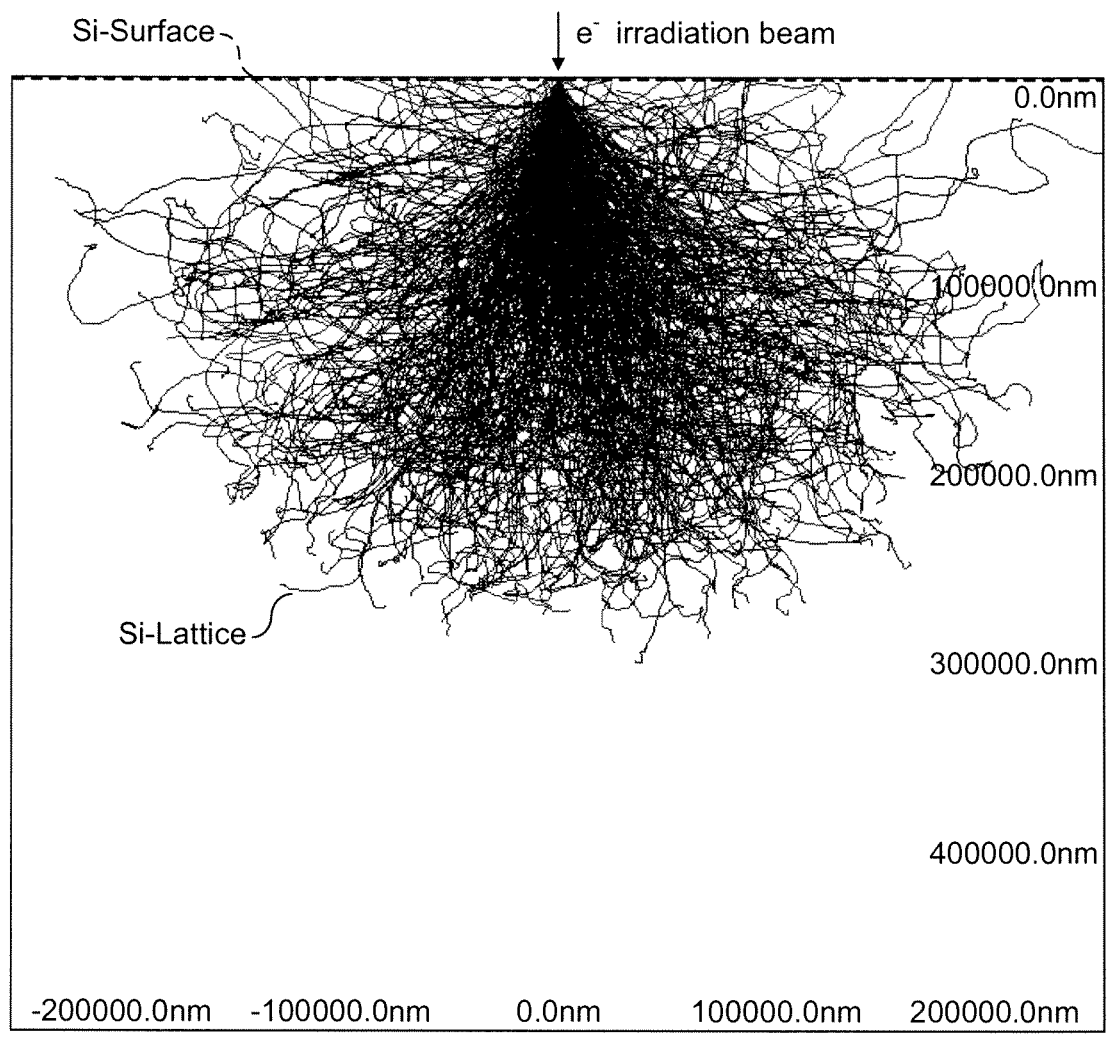
FIG. 1 shows a simulation of the trajectories of 250 keV electrons in a silicon lattice, modeled using the simulation package CASINO. Lateral scattering of approximately +/-200 µm is observed.
Figure 2:
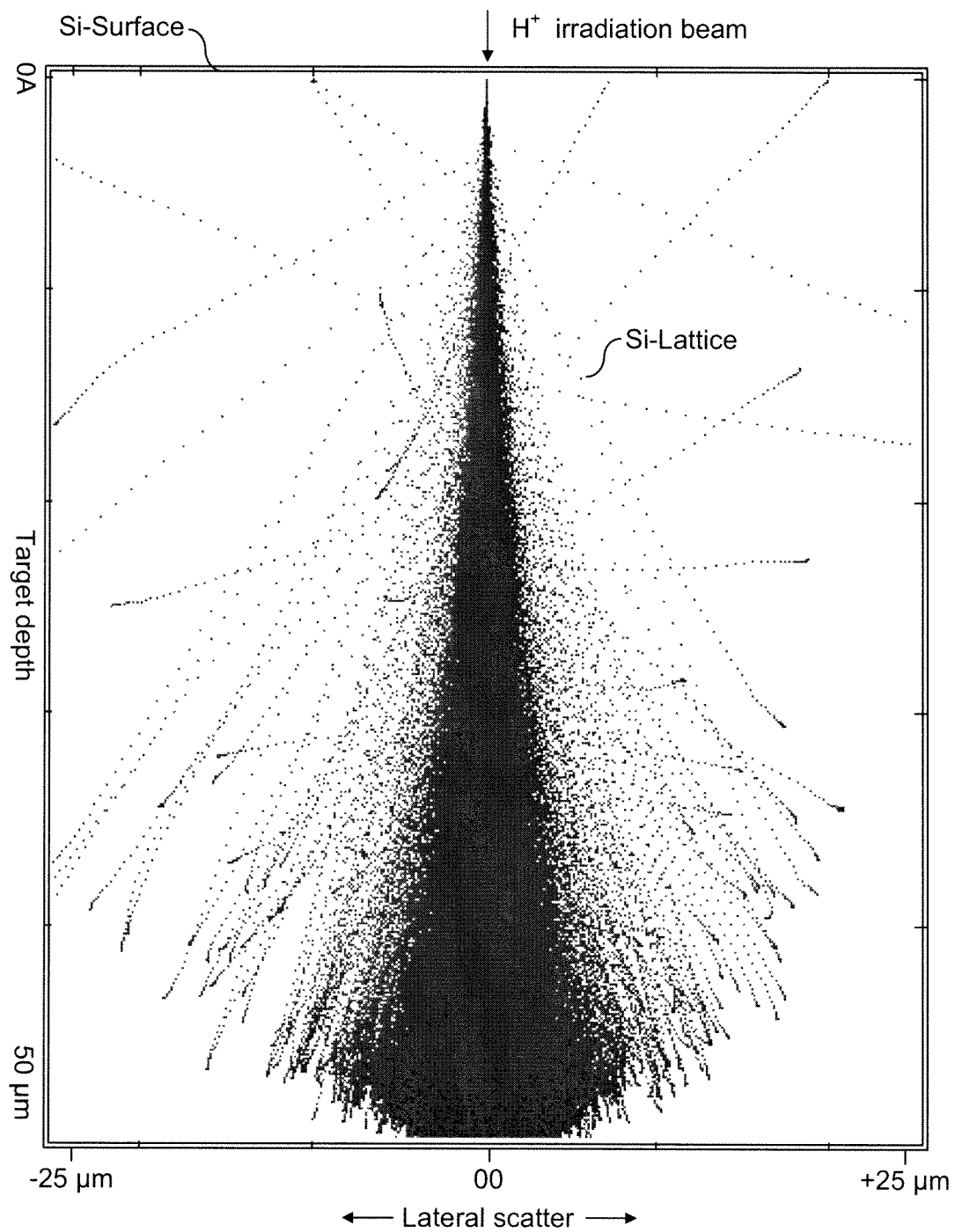
FIG. 2 shows a simulation of the trajectories of 2 MeV protons in a silicon lattice, modeled using the simulation package TRIM.
Figure 3:
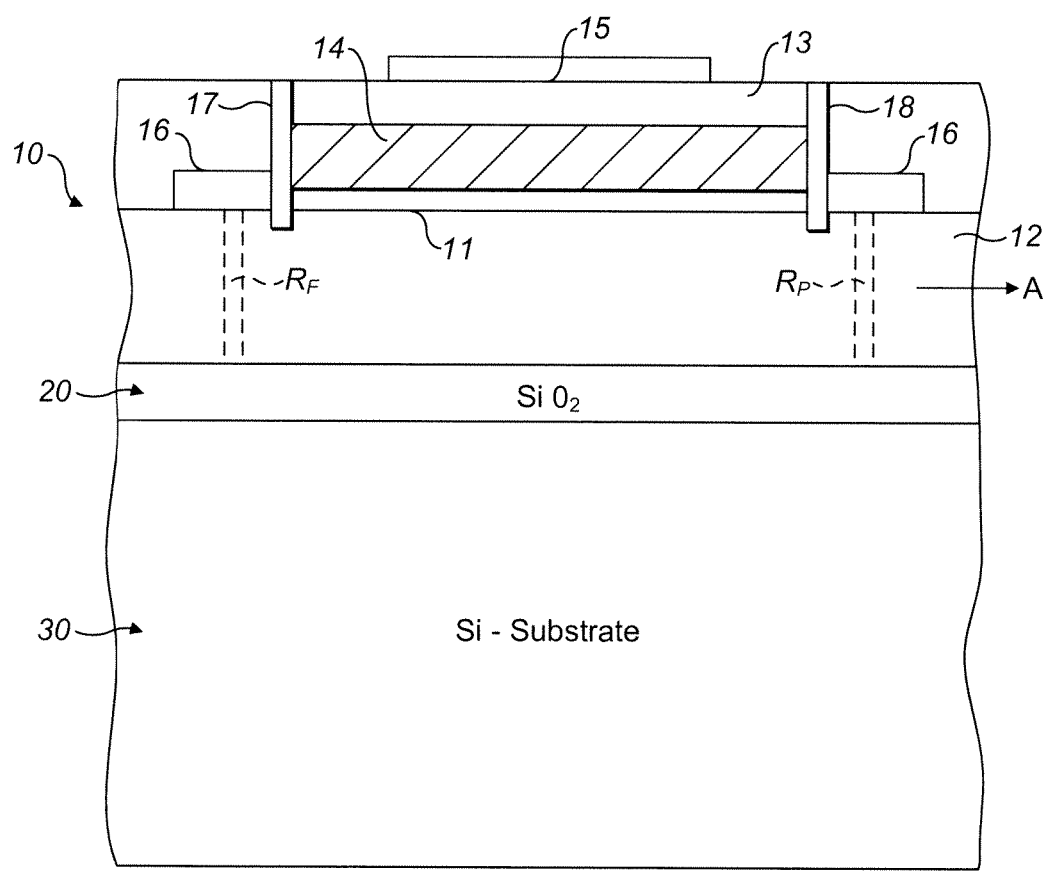
FIG. 3 is a schematic, transverse view through part of an optoelectronic integrated circuit incorporating a light emitting diode manufactured using a method according to the invention.
Figure 4:
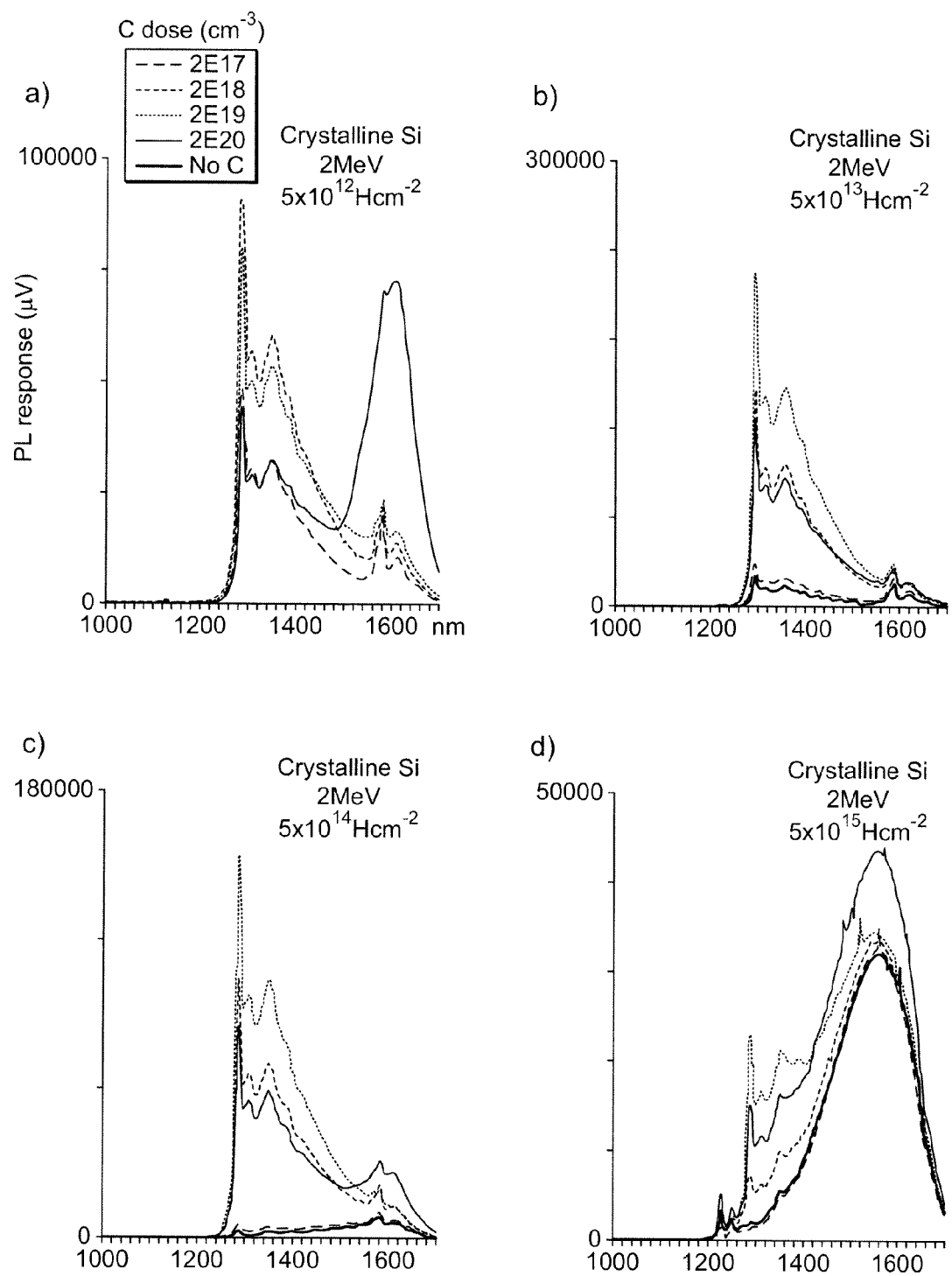

FIG. 3 of the drawings is a schematic, transverse sectional view through part of an example of an optoelectronic integrated circuit incorporating a light emitting diode (LED) 10 manufactured using a method according to the invention.

In this preferred implementation, the LED 10 is produced on a SOI platform. To that end, the LED 10 sits on top of an electrically insulating oxide ($SiO_2$) layer 20 buried in a silicon substrate 30. It will be appreciated that the sectional view shown in FIG. 3 is not to scale. Typically, the LED 10 has a sub-micron thickness, or a thickness of 3-5 µm at most, whereas the oxide layer 20 typically has a thickness of about 3 µm.

The LED 10 has a p-n junction 11 defined at the boundary of a region 12 of n-type silicon and a region 13 of p-type silicon. In this embodiment, region 12 is doped with phosphorous ions (P) and region 13 is doped with boron ions (B). It will be appreciated that other suitable dopants known to those skilled in the art could alternatively be used. Region 13 also has a photoactive region 14 containing radiative defect centres; that is, G-centres having the form of $C_s$—$Si_I$—$C_s$ complexes, where $C_s$ is a substitutional carbon atom and $Si_I$ is an interstitial silicon atom. Ohmic contacts 15,16 are attached to the p- and n- type regions 13,12 respectively, and oxide-filled trenches 17,18 are provided to isolate region 13 from contacts 16, enabling a bias voltage to be applied across the p-n junction 11.

Luminescence produced in operation of the LED is directed laterally, as indicated by arrow A, and may be received by another device (not shown) e.g. an optical waveguide or a photodetector with which the LED shares the SOI platform.

In one implementation of the invention, the LED may be fabricated by initially implanting boron ions in a layer of device grade, n-type silicon having a resistance typically in the range from 2-4 Ohm-cm to form the p-type region 13. An implantation dose of $10^{15}$ $Bcm^{-2}$ and an implantation energy of 30 keV is generally preferred; however, it will be appreciated that implantation doses typically in the range $10^{12}$ to $10^{17}$ $Bcm^{-2}$ and implantation energies typically in the range 10-80 keV could alternatively be used.

Carbon ions are then implanted in region 13 to create a concentration of carbon atoms occupying substitutional sites in the silicon lattice. To that end, at least two different carbon ion implantation energies (10 keV and 30 keV in this example) may be used to control the concentration of the implanted ions as a function of implantation depth to produce a near constant concentration to a depth of about 100 nm from the exposed surface of region 13.

The device is then annealed, typically at 1000° C. for several tens of seconds (typically 30 to 60 seconds) to remove implantation damage and to allow the implanted carbon atoms to occupy the substitutional lattice sites. The annealing process also serves to activate the implanted boron ions.

The exposed surface of region 13 is then irradiated with protons to create the required G-centre complexes in the photoactive region 14. The ohmic contacts 15,16 are then attached.

Photoluminescence (PL) measurements were carried out on different crystalline silicon samples containing G-centres manufactured using a range of different carbon concentrations and a range of different proton irradiation energies and doses. To that end, a sample was mounted in a variable temperature, continuous flow, liquid nitrogen cryostat placed in front of a conventional 1 meter spectrometer. A liquid nitrogen-cooled germanium p-i-n diode was used to detect luminescence in the wavelength range from 1000 nm to 1700 nm and a liquid nitrogen-cooled extended Ge detector was used to detect luminescence in the wavelength range from 1000 nm to 1600 nm. PL was excited by exposing the sample to light produced by an argon laser at an excitation wavelength of 514 nm.

The results obtained from the PL measurements are described with reference to FIGS. 4 to 7.

FIGS. 4a to 4d show photoluminescence (PL) spectra obtained from a range of crystalline silicon samples containing different implanted carbon concentrations, in the range from $2 \times 10^{17}$ to $2 \times 10^{20}$ Ccm$^{-3}$ and samples without carbon implantation (labeled as "No C"), that were irradiated with protons (H$^+$) having a proton irradiation energy of 2 MeV and proton irradiation doses of $5 \times 10^{12}$ H$^+$ cm$^{-2}$, $5 \times 10^{13}$ H$^+$ cm$^{-2}$, $5 \times 10^{14}$ H$^+$ cm$^{-2}$ and $5 \times 10^{15}$ H$^+$ cm$^{-2}$, respectively.

These measurements show the same strong luminescence of the G-line (i.e. 1280 nm). However, at the highest proton irradiation dose measured ($5 \times 10^{15}$ H$^+$ cm$^{-2}$) (FIG. 4d), the resultant damage gives rise to additional broad emission centred on 1570 nm, which tends to dominate the emission spectra, quenching the G-centre emission. Other strong luminescences were observed in most samples at 1346 nm.

In general, the measurements show that for a given proton irradiation energy (2 MeV in this example) the optimum proton irradiation dose depends on the concentration of substitutional carbon atoms implanted in the silicon lattice.

FIGS. 5 and 6 are plots of PL peak intensity (at the G-centre line 1280 nm) as a function of carbon concentration and proton irradiation dose respectively obtained (in part) from the data shown in FIGS. 4a to 4d.

The curves shown in FIG. 5a suggest that optimum emission is obtained using a proton irradiation dose of $5 \times 10^{13}$ H$^+$ cm$^{-2}$ with a carbon concentration of $2 \times 10^{19}$ Ccm$^{-3}$.

FIG. 6, in the other hand, shows that the optimum emission was obtained using proton irradiation doses of $3 \times 10^{13}$ H$^+$ cm$^{-2}$, $7 \times 10^{13}$ H$^+$ cm$^{-2}$ and $3 \times 10^{14}$ H$^+$ cm$^{-2}$ with carbon concentrations of $1.4 \times 10^{18}$ Ccm$^{-3}$, $4 \times 10^{18}$ Ccm$^{-3}$ and $1 \times 10^{19}$ Ccm$^{-3}$ respectively. In general, both sets of curves demonstrate that the greater the carbon concentration, the higher the proton irradiation dose to achieve optimum luminescence.

FIG. 7 shows plots of PL peak intensity (at the G-centre line) as a function of carbon concentration, obtained using different proton irradiation energies (0.5 MeV, 1 MeV and 2 MeV). These curves demonstrate that the greater the carbon concentration the lower the proton irradiation energy needed to achieve optimum emission.

As already explained, a greater carbon concentration suggests use of a higher optimum proton irradiation dose. The product of proton irradiation energy and proton irradiation dose is a measure of total energy per unit area transferred to the silicon lattice as a result of the proton irradiation process. For a given carbon concentration, it is preferable that this product should be kept substantially constant to optimize the emission and reduce unwanted, non-radiative damage.

It will be appreciated that although the optoelectronic device described with reference to FIG. 3 is a light emitting diode, the present invention embraces other forms of photo-emitter; for example, optical amplifiers such as lasers and Schottky diodes. In one implementation, a laser according to the invention has a structure similar to that of the LED 10, described with reference to FIG. 3, but has an optical cavity formed by fully and partially reflecting elements (R$_F$, R$_p$, respectively in FIG. 3) at each end of the device.

Furthermore, although the LED 10 described with reference to FIG. 3 is produced on a SOI platform and is part of an optoelectronic integrated circuit, the present invention embraces stand-alone devices such as LEDs, optical amplifiers, lasers and other forms of photoemitter such as the Schottky diode.

In the foregoing embodiments, the required substitutional carbon atoms are created in the silicon lattice by an ion implantation process, and preamorphisation of the silicon with atoms such as Ge and Sn may be used to assist this process.

Alternatively, it is possible to provide a carbon rich silicon wafer produced by pulling the silicon crystal from a carbon-doped melt.

As has been explained, the use of proton irradiation in the creation of G-centre complexes significantly reduces lateral scattering and related collision damage associated, hitherto, with electron irradiation and, therefore, is more readily implemented in CMOS fabrication environments, such as ULSI technology, requiring high integration density.

The invention claimed is:

1. A method of manufacture of an optoelectronic device including the steps of:
providing or forming a body of crystalline silicon containing substitutional carbon atoms, and irradiating said body of crystalline silicon with protons (H$^+$) to create radiative defect centres in a photoactive region of the device, wherein at least some of said defect centres are G-centre complexes having the form C$_s$—Si$_I$—C$_s$, where C$_s$ is a substitutional carbon atom and Si$_I$ is an interstitial silicon atom.

2. A method as claimed in claim 1 wherein said step of forming includes implanting carbon ions in said body of crystalline silicon to produce a concentration of substitutional carbon atoms in the range from $10^{17}$Ccm$^{-3}$ to $10^{21}$Ccm$^{-3}$.

3. A method as claimed in claim 2 including the step of annealing said body of crystalline silicon after implanting said carbon ions and prior to irradiating said body with protons.

4. A method as claimed in claim 3 including annealing said body at 1000° C. for up to 1 minute.

5. A method as claimed in claim 1 wherein said step of forming includes implanting carbon ions at two or more different carbon implantation energies to control carbon concentration as a function of implantation depth.

6. A method as claimed in claim 5 wherein said carbon implantation energies are 10 keV and 30 keV to produce a substantially constant carbon concentration to an implantation depth of 100 nm.

7. A method as claimed in claim 1 including irradiating said body of crystalline silicon with protons having a proton irradiation energy in the range from 1 keV to 10 MeV.

8. A method as claimed in claim 7 wherein the proton irradiation energy is in the range from 0.5 MeV to 2 MeV.

9. A method as claimed in claim 1 including irradiating said body of crystalline silicon with protons having a proton irradiation dose in the range from $1 \times 10^{11}$H$^+$cm$^{-2}$ to $1 \times 10^{16}$H$^+$cm$^{-2}$.

10. A method as claimed in claim 9 wherein the proton irradiation dose is in the range from $1 \times 10^{13}$H$^+$cm$^{-2}$ to $5 \times 10^{14}$H$^+$cm$^{-2}$.

11. A method as claimed in claim 1 wherein the proton irradiation energy is in the range from 0.5 MeV to 2 MeV and the proton irradiation dose is in the range from $1 \times 10^{13}$H$^+$cm$^{-2}$ to $5 \times 10^{14}$H$^+$cm$^{-2}$, and wherein higher irradiation energies correspond to lower irradiation doses.

12. An optoelectronic device manufactured using a method as claimed in claim 1.

13. An optoelectronic device as claimed in claim 12 having a junction defined by a p-type region and/or a n-type region, and wherein said photoactive region of the device is situated in a said p-type or n-type region.

14. An optoelectronic device as claimed in claim 13 in the form of a light emitting diode.

15. An optoelectronic device as claimed in claim 13 in the form of an optical amplifier.

16. An optoelectronic device as claimed in claim 15 wherein the optical amplifier is a laser, said junction being provided with fully and partially reflective elements forming an optical cavity in the device.

17. An optoelectronic integrated circuit including at least one optoelectronic device as claimed in claim 12.

18. An optoelectronic integrated circuit as claimed in claim 17 wherein the at least one optoelectronic device is produced on a Silicon-On-Insulator platform.

19. A method for forming G-centres in crystalline silicon, including the steps of: providing or forming a body of crystalline silicon containing substitutional carbon atoms, and irradiating said body of crystalline silicon with protons ($H^+$) to create radiative defect centres, wherein at least some of said defect centres are G-centre complexes having the form $C_s$-$Si_I$-$C_s$ where $C_s$ is a substitutional carbon atom and $Si_I$ is an interstitial silicon atom.

20. A method as claimed in claim 19 wherein said step of forming includes implanting carbon ions in said body of crystalline silicon to produce a concentration of substantial carbon atom in the range from $10^{17}$ $Ccm^{-3}$ to $10^{21}$ $Ccm^{-3}$.

21. A method as claimed in claim 20 including the step of annealing said body of crystalline silicon after implanting said carbon ions and prior to irradiating said body with protons.

22. A method as claimed in claim 21 including annealing said body at 1000° C. for up to 1 minute.

23. A method as claimed in claim 19 wherein said step of forming includes implanting carbon ions at two or more different carbon implantation energies to control carbon concentration as a function of implantation depth.

24. A method as claimed in claim 23 wherein said carbon implantation energies are 10 keV and 30 keV to produce a substantially constant carbon concentration to an implantation depth of 100 nm.

25. A method as claimed in claim 19 including irradiating said body of crystalline silicon with protons having a proton irradiation energy in the range from 1 keV to 10 MeV.

26. A method as claimed in claim 25 wherein the proton irradiation energy is in the range from 0.5 MeV to 2 MeV.

27. A method as claimed in claim 19 including irradiating said body of crystalline silicon with protons having a proton irradiation dose in the range from $1\times10^{11} H^+ cm^{-2}$ to $1\times10^{16} H^+ cm^{-2}$.

28. A method as claimed in claim 27 wherein the proton irradiation dose is in the range from $1\times10^{13} H^+ cm^{-2}$ to $5\times10^{14} H^+ cm^{-2}$.

29. A method as claimed in claim 19 wherein the proton irradiation energy is in the range from 0.5 MeV to 2 MeV and the proton irradiation dose is in the range from $1\times10^{13} H^+ cm^{-2}$ to $5\times10^{14} H^+ cm^{-2}$, and wherein higher irradiation energies correspond to lower irradiation doses.

* * * * *